(12) United States Patent
Akram et al.

(10) Patent No.: US 7,256,069 B2
(45) Date of Patent: Aug. 14, 2007

(54) WAFER-LEVEL PACKAGE AND METHODS OF FABRICATING

(75) Inventors: Salman Akram, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/832,160

(22) Filed: Apr. 9, 2001

(65) Prior Publication Data
US 2001/0021541 A1 Sep. 13, 2001

Related U.S. Application Data

(63) Continuation of application No. 09/340,513, filed on Jun. 28, 1999, now Pat. No. 6,228,687.

(51) Int. Cl.
H01L 21/00 (2006.01)
H01L 21/44 (2006.01)
H01L 21/31 (2006.01)
H01L 21/469 (2006.01)

(52) U.S. Cl. ............... 438/108; 438/125; 438/611; 438/613; 438/615; 438/667; 438/680; 438/763; 438/780

(58) Field of Classification Search ........... 438/125, 438/106, 108, 127, 611–617, 667, 680, 681, 438/761, 763, 780, 977, FOR. 363, FOR. 485, 438/FOR. 495; 257/758, 759, 760, 698, 257/736
See application file for complete search history.

(56) References Cited

U.S. PATENT DOCUMENTS

| | | | |
|---|---|---|---|
| 4,341,594 A | | 7/1982 | Carlson et al. |
| 4,618,878 A | * | 10/1986 | Aoyama et al. ............ 257/759 |
| 4,803,147 A | | 2/1989 | Mueller et al. |
| 4,948,754 A | | 8/1990 | Kondo et al. |
| 5,049,980 A | | 9/1991 | Saito et al. |
| 5,111,279 A | * | 5/1992 | Pasch et al. ................ 257/778 |
| 5,168,346 A | * | 12/1992 | Pasch et al. ................ 257/738 |
| 5,207,887 A | * | 5/1993 | Crumly et al. ............... 205/78 |
| 5,275,973 A | * | 1/1994 | Gelatos ...................... 438/623 |

(Continued)

Primary Examiner—David E. Graybill
(74) Attorney, Agent, or Firm—TraskBritt

(57) ABSTRACT

A carrier for use in a chip-scale package, including a polymeric film with apertures defined therethrough. The apertures, which are alignable with corresponding bond pads of a semiconductor device, each include a quantity of conductive material extending substantially through the length thereof. The carrier may also include laterally extending conductive traces in contact with or otherwise in electrical communication with the conductive material in the apertures of the carrier. Contacts may be disposed on a backside surface of the carrier. The contacts may communicate with the conductive material disposed in the apertures of the carrier. A conductive bump, such as a solder bump, may be disposed adjacent each or any of the contacts. A chip-scale package including the carrier of the present invention is also within the scope of the present invention. Such a chip-scale package includes a semiconductor device invertedly disposed over the carrier such that bond pads of the semiconductor device substantially align with apertures formed through the carrier. Thus, the bond pads of the semiconductor device may communicate with the conductive bumps by means of the conductive material disposed in the apertures of the carrier. Methods of fabricating the carrier of the present invention and methods of fabricating chip-scale packages including the carrier are also within the scope of the present invention.

20 Claims, 7 Drawing Sheets

U.S. PATENT DOCUMENTS

| | | | | |
|---|---|---|---|---|
| 5,299,730 | A * | 4/1994 | Pasch et al. | 228/180.22 |
| 5,323,060 | A | 6/1994 | Fogal et al. | |
| 5,347,162 | A * | 9/1994 | Pasch | 257/773 |
| 5,366,906 | A | 11/1994 | Wojnarowski et al. | |
| 5,384,488 | A | 1/1995 | Golshan et al. | |
| 5,410,805 | A * | 5/1995 | Pasch et al. | 29/830 |
| 5,468,681 | A * | 11/1995 | Pasch | 438/108 |
| 5,489,804 | A * | 2/1996 | Pasch | 257/778 |
| 5,504,035 | A * | 4/1996 | Rostoker et al. | 228/180.22 |
| 5,506,756 | A | 4/1996 | Haley | |
| 5,527,741 | A | 6/1996 | Cole et al. | |
| 5,554,887 | A | 9/1996 | Sawai et al. | 257/737 |
| 5,565,033 | A * | 10/1996 | Gaynes et al. | 118/210 |
| 5,569,963 | A * | 10/1996 | Rostoker et al. | 257/773 |
| 5,658,827 | A * | 8/1997 | Aulicino et al. | 228/180.22 |
| 5,672,912 | A | 9/1997 | Aoki et al. | |
| 5,677,576 | A * | 10/1997 | Akagawa | 257/785 |
| 5,679,977 | A * | 10/1997 | Khandros et al. | 257/692 |
| 5,683,942 | A | 11/1997 | Kata et al. | |
| 5,770,889 | A * | 6/1998 | Rostoker et al. | 257/698 |
| 5,814,894 | A | 9/1998 | Igarashi et al. | |
| 5,821,624 | A * | 10/1998 | Pasch | 257/776 |
| 5,834,799 | A * | 11/1998 | Rostoker et al. | 257/98 |
| 5,834,844 | A | 11/1998 | Akagawa et al. | |
| 5,843,798 | A * | 12/1998 | Matsuda | 438/106 |
| 5,844,304 | A | 12/1998 | Kata et al. | |
| 5,851,911 | A | 12/1998 | Farnworth | |
| 5,886,409 | A | 3/1999 | Ishino et al. | |
| 5,886,415 | A | 3/1999 | Akagawa | |
| 5,907,787 | A * | 5/1999 | Sato | 438/622 |
| 5,925,931 | A | 7/1999 | Yamamoto | |
| 5,946,555 | A * | 8/1999 | Crumly et al. | 438/125 |
| 5,971,253 | A * | 10/1999 | Gilleo et al. | 228/180.22 |
| 5,977,641 | A | 11/1999 | Takahashi et al. | |
| 6,030,889 | A * | 2/2000 | Aulicino et al. | 438/613 |
| 6,043,109 | A | 3/2000 | Yang et al. | |
| 6,054,761 | A * | 4/2000 | McCormack et al. | 257/698 |
| 6,069,071 | A * | 5/2000 | Hasunuma et al. | 438/637 |
| 6,071,810 | A * | 6/2000 | Wada et al. | 438/635 |
| 6,072,236 | A | 6/2000 | Akram et al. | |
| 6,117,539 | A | 9/2000 | Crotzer et al. | |
| 6,132,587 | A * | 10/2000 | Jorne et al. | 205/123 |
| 6,165,885 | A * | 12/2000 | Gaynes et al. | 438/612 |
| 6,172,569 | B1 | 1/2001 | McCall et al. | |
| 6,179,200 | B1 * | 1/2001 | Kung et al. | 228/254 |
| 6,181,569 | B1 * | 1/2001 | Chakravorty | 361/761 |
| 6,211,572 | B1 * | 4/2001 | Fjelstad et al. | 257/781 |
| 6,212,767 | B1 | 4/2001 | Tandy | |
| 6,228,687 | B1 * | 5/2001 | Akram et al. | 438/125 |
| 6,233,184 | B1 * | 5/2001 | Barth et al. | 365/201 |
| 6,255,737 | B1 * | 7/2001 | Hashimoto | 257/784 |
| 6,284,563 | B1 * | 9/2001 | Fjelstad | 438/106 |
| 6,285,203 | B1 | 9/2001 | Akram et al. | |
| 6,294,407 | B1 * | 9/2001 | Jacobs | 438/118 |
| 6,306,680 | B1 | 10/2001 | Fillion et al. | |
| 6,319,810 | B1 * | 11/2001 | Ochiai et al. | 438/616 |
| 6,334,249 | B2 * | 1/2002 | Hsu | 29/852 |
| 6,343,171 | B1 * | 1/2002 | Yoshimura et al. | 385/50 |
| 6,348,731 | B1 * | 2/2002 | Ashley et al. | 257/751 |
| 6,376,904 | B1 | 4/2002 | Haba et al. | |
| 6,392,306 | B1 * | 5/2002 | Khandros et al. | 257/783 |
| 6,434,017 | B1 | 8/2002 | Iwabuchi | |
| 6,458,231 | B1 * | 10/2002 | Wapner et al. | 156/173 |
| 6,475,896 | B1 * | 11/2002 | Hashimoto | 438/613 |
| 6,492,200 | B1 * | 12/2002 | Park et al. | 438/113 |
| 6,515,370 | B2 * | 2/2003 | Hashimoto | 257/777 |
| 6,534,853 | B2 | 3/2003 | Liu et al. | |
| 6,573,609 | B2 | 6/2003 | Fjelstad | |
| 6,590,292 | B1 * | 7/2003 | Barber et al. | 257/778 |
| 2001/0006759 | A1 * | 7/2001 | Shipley et al. | 430/280.1 |
| 2003/0038378 | A1 * | 2/2003 | Jacobs | 257/783 |

* cited by examiner

WAFER-LEVEL PACKAGE AND METHODS OF FABRICATING

CROSS-REFERENCE TO RELATED APPLICATION

This application is a continuation of application Ser. No. 09/340,513, filed Jun. 28, 1999, now U.S. Pat. No. 6,228,687, issued May 8, 2001.

BACKGROUND OF THE INVENTION

1. Field of the Invention

The present invention relates to carrier substrates for use in chip-scale packages and to chip-scale packages including such carrier substrates. Particularly, the present invention relates to carrier substrates fabricated from polymeric materials. Methods of fabricating chip-scale packages are also within the scope of the present invention.

2. Background of Related Art

In conventional semiconductor device fabrication processes, a number of distinct semiconductor devices, such as memory chips or microprocessors, are fabricated on a semiconductor substrate, such as a silicon wafer. After the desired structures, circuitry, and other features of each of the semiconductor devices have been fabricated upon the semiconductor substrate, the substrate is typically singulated to separate the individual semiconductor devices from one another.

Various post-fabrication processes, such as testing the circuits of each of the semiconductor devices and burn-in processes, may be employed either prior to or following singulation of the semiconductor substrate. These post-fabrication processes may be employed to impart the semiconductor devices with their intended functionality and to determine whether or not each of the individual semiconductor devices meets quality control specifications.

The individual semiconductor devices may then be packaged. Along with the trend in the semiconductor industry to decrease semiconductor device size and increase the density of structures of semiconductor devices, package sizes are also ever-decreasing. One type of semiconductor device package, the so-called "chip-scale package" or "chip-sized package" ("CSP"), consumes about the same amount of real estate upon a substrate as the bare semiconductor device itself. Such chip-scale packages typically include a carrier substrate having roughly the same surface area as the semiconductor device.

Some chip-scale packages include a semiconductor device and a polymeric carrier substrate. Exemplary chip-scale packages with polymeric carrier substrates are disclosed in U.S. Pat. No. 5,677,576 (hereinafter "the '576 Patent"), which issued to Masatoshi Akagawa on Oct. 14, 1997, U.S. Pat. No. 5,683,942 (hereinafter "the '942 Patent"), which issued to Keiichiro Kata et al. on Nov. 4, 1997, and U.S. Pat. No. 5,844,304 (hereinafter "the '304 Patent"), which issued to Keiichiro Kata et al. on Dec. 1, 1998.

The '576 Patent discloses a chip-scale package that includes a semiconductor device, a layer of insulative material, through which bond pads of the semiconductor device are exposed, disposed on an active surface of the semiconductor device, and a conductive elastomer disposed adjacent the layer of insulative material and the bond pads of the semiconductor device. Conductive elements are positioned adjacent the conductive elastomer so as to facilitate the disposition of a conductive bump that is laterally offset from the bond pad location. A photoresist, including apertures through which portions of the conductive elements are exposed, is then disposed over the conductive elements and the conductive elastomer. Conductive bumps are disposed within the apertures and in communication with the conductive elements. The carrier substrate and method of the '576 Patent are somewhat undesirable because the disposal of an additional layer of insulative material on the active surface of the semiconductor device may increase fabrication time and costs, as well as the likelihood of device failure. Moreover, as each of the bond pads is associated with a laterally extending conductive element, each of the conductive bumps is, somewhat undesirably, laterally offset from the location of its corresponding bond pad.

The '942 Patent describes a carrier substrate including a polymer layer including conductive traces with raised contact pads disposed on a first side thereof and corresponding conductive bumps disposed on the other side thereof. The conductive traces and their corresponding conductive bumps communicate by means of electrically conductive vias through the carrier substrate. A layer of insulative material is disposed upon the active surface of the semiconductor device with which the carrier substrate is to be assembled, laterally adjacent the bond pads. The carrier substrate, which is pre-fabricated, is disposed adjacent the active surface of a semiconductor device by aligning the contact pads of the carrier substrate with the bond pads of the semiconductor device, disposing a quantity of adhesive material between the active surface and the carrier substrate, and applying pressure to the carrier substrate to abut the contact pads against their corresponding bond pads. Pressure is applied locally to the contact pads and, thus, to the bond pads through apertures defined through the carrier substrate. The carrier substrate of the '942 Patent is somewhat undesirable in several respects. The disposal of a layer of insulative material laterally adjacent the bond pads of the semiconductor device increases fabrication time and costs, as well as the likelihood of device failure. The semiconductor device may be damaged while localized pressure is applied to the bond pads thereof, again undesirably increasing the likelihood of device failure and, therefore, fabrication costs. Moreover, since the carrier substrate of the '942 Patent is pre-fabricated, it is possible that the raised contact pads of the carrier substrate may not properly align with their corresponding bond pads of the semiconductor device.

The polymeric carrier substrate of the '304 Patent is fabricated directly upon an active surface of a semiconductor device. That carrier substrate, however, does not include electrically conductive vias that extend substantially longitudinally therethrough. Rather, a layer of insulative material is disposed on an active surface of a semiconductor device upon which the carrier substrate is to be fabricated, adjacent the bond pads thereof. Laterally extending conductive lines are fabricated on the layer of insulative material and in contact with corresponding bond pads of the semiconductor device. Conductive bumps are then disposed adjacent corresponding conductive lines and a layer of polymeric material applied to the semiconductor device so as to insulate the conductive lines. The conductive bumps are exposed through the layer of polymeric material. Since each of the conductive lines of the carrier substrate of the '304 Patent extends substantially laterally from its corresponding bond pad, each of the conductive bumps is, somewhat undesirably, laterally offset from the location of its corresponding bond pad. Moreover, the disposal of an additional layer of insulative material on the active surface of the semiconductor device, through which the bond pads are disposed, increases fabrication time and costs, as well as the likelihood of device failure.

As the carrier substrate of such chip-scale packages is small, electrical connections between the semiconductor device and the carrier substrate are often made by flip-chip-type bonds or tape-automated bonding ("TAB"). Due to the typical use of a carrier substrate that has a different coefficient of thermal expansion than the semiconductor substrate of the semiconductor device, these types of bonds may fail during operation of the semiconductor device.

Following packaging, the packaged semiconductor devices may be re-tested or otherwise processed to ensure that no damage occurred during packaging. The testing of individual packaged semiconductor devices is, however, somewhat undesirable since each package must be individually aligned with such testing or probing equipment.

Accordingly, there is a need for a chip-scale package with at least some conductive bumps or contacts that are not laterally offset from the position of their corresponding bond pad and for a packaging method that does not require the disposal of an additional layer of insulative material adjacent the active surface of the semiconductor device. There is also a need for a semiconductor packaging process that facilitates testing, probing, and burn-in of semiconductor devices without requiring the alignment of individual semiconductor devices and by which a plurality of reliable chip-scale packages may be substantially simultaneously assembled. An efficient chip-scale packaging process with a reduced incidence of semiconductor device failure is also needed. There is a further need for chip-scale packaged semiconductor devices that consume about the same amount of real estate as the semiconductor devices thereof and that withstand repeated exposure to the operating conditions of the semiconductor device.

SUMMARY OF THE INVENTION

The present invention includes a chip-scale package ("CSP") including a semiconductor device having at least one bond pad on an active surface thereof and a carrier substrate, which is also referred to herein as a carrier, adjacent the active surface of the semiconductor device and including at least one electrically conductive via therethrough. The at least one electrically conductive via preferably extends directly through or substantially longitudinally through the carrier substrate and is alignable with the at least one bond pad of the semiconductor device. The carrier substrate may also include at least one conductive bump in communication with the at least one electrically conductive via and disposed opposite the semiconductor device. The at least one electrically conductive bump may be disposed adjacent the at least one electrically conductive via. Alternatively, the carrier substrate may carry at least one conductive trace that extends substantially laterally from the at least one electrically conductive via. The at least one conductive bump may be disposed in contact with the at least one electrically conductive trace and, therefore, the at least one electrically conductive bump may be laterally offset from its corresponding bond pad of the semiconductor device.

Preferably, the carrier substrate comprises a layer of polymeric material, such as a polyimide. The polymeric material is preferably disposed in a thickness or has a coefficient of thermal expansion that will not induce stress in the conductive links between the semiconductor device and the carrier substrate under the operating conditions of the semiconductor device (e.g., the operating temperature of the semiconductor device). Accordingly, in accordance with the method of the present invention, the carrier substrate may be secured to the active surface of the semiconductor device by disposing and spreading a quantity of polymeric material on the active surface of the semiconductor device to a substantially consistent thickness. Alternatively, a preformed film of the polymeric material may be adhered or otherwise secured to the active surface of the semiconductor device. The layer of polymeric material may be disposed on the semiconductor device either before or after the semiconductor device has been singulated from a wafer.

Apertures may be defined through the layer of polymeric material by known processes, such as by laser-drilling, by masking and etching, or by photoimaging the layer of polymeric material. These apertures may be defined after the layer of polymeric material has been secured to the active surface of the semiconductor device. Alternatively, if a preformed film of polymeric material is secured to the active surface of the semiconductor device, the apertures may also be preformed. If the layer of polymeric material comprises a preformed film of polymeric material having preformed apertures therethrough, each aperture is preferably substantially alignable with its corresponding bond pad of the semiconductor device as the polymeric film is secured to the active surface of the semiconductor device.

A quantity of conductive material may be disposed in each aperture of the layer of polymeric material and, therefore, in contact with the bond pad that corresponds to the aperture. Each aperture and the quantity of conductive material therein collectively define a conductive via of the carrier substrate.

Conductive traces that extend substantially laterally from selected ones of the electrically conductive vias may also be fabricated on the carrier substrate, opposite the semiconductor device. Preferably, these conductive traces are positioned to laterally offset the locations of contacts or conductive bumps of the carrier substrate relative to the locations of their corresponding bond pads of the semiconductor device. Accordingly, the conductive traces may impart the carrier substrate with a footprint that differs from that of the semiconductor device to which the carrier substrate is secured.

Conductive bumps may be disposed on a surface of the carrier substrate opposite the semiconductor device. Each conductive bump preferably communicates with at least one corresponding bond pad of the semiconductor device. Accordingly, the conductive bumps may be disposed in contact with either an electrically conductive via or a substantially laterally extending conductive trace of the carrier substrate.

Other features and advantages of the present invention will become apparent to those of ordinary skill in the art through a consideration of the ensuing description, the accompanying drawings, and the appended claims.

DETAILED DESCRIPTION OF THE INVENTION

Figure 1:
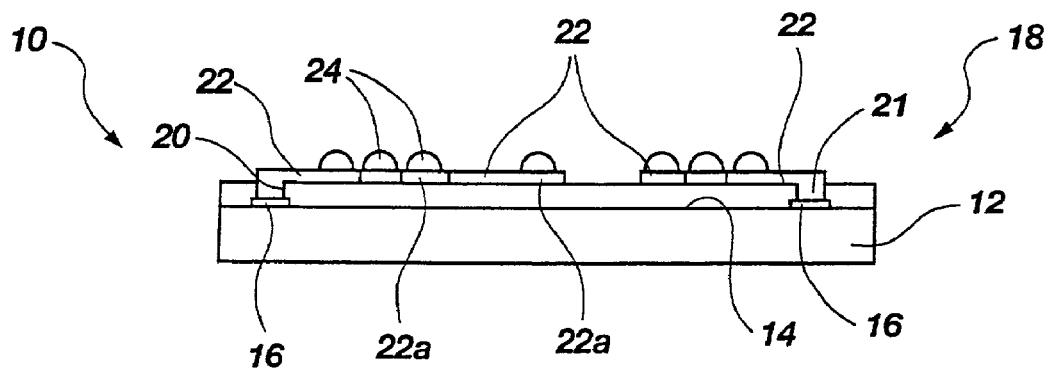
FIG. 1 is a cross-sectional representation of a first embodiment of a chip-scale package according to the present invention.

With reference to FIG. 1, a preferred embodiment of a chip-scale package 10 ("CSP") according to the present invention is illustrated. Chip-scale package 10 includes a semiconductor device 12 and a carrier substrate 18 disposed adjacent an active surface 14 of semiconductor device 12.

Semiconductor device 12 is preferably a flip-chip-type semiconductor device, including bond pads 16 disposed on active surface 14 thereof in either an array thereover or proximate the periphery of semiconductor device 12. However, semiconductor devices that include peripherally located bond pads are also within the scope of the present invention.

Carrier substrate 18 comprises a polymeric material, such as a polyimide, and has a substantially consistent thickness. Carrier substrate 18 includes electrically conductive vias 21, which are also referred to herein as vias for simplicity, extending therethrough and in communication and substantial alignment with their corresponding bond pads 16. As illustrated, carrier substrate 18 may also include conductive traces 22 that extend substantially laterally from selected ones of electrically conductive vias 21 and that communicate with their corresponding electrically conductive vias 21. These conductive traces 22 extend substantially laterally from their corresponding electrically conductive vias 21 and may be carried on a surface of carrier substrate 18 opposite semiconductor device 12 or may otherwise be carried by carrier substrate 18. Carrier substrate 18 may also have electrically conductive bumps 24 disposed in communication with corresponding electrically conductive vias 21. These electrically conductive bumps 24 may be disposed adjacent their corresponding electrically conductive vias 21 or in contact with conductive traces 22 that correspond to their corresponding electrically conductive vias 21. The conductive bumps 24 may be disposed in direct contact with their corresponding electrically conductive via 21 or conductive trace 22. Alternatively, conductive bumps 24 may be disposed in communication with their corresponding electrically conductive via 21 or conductive trace 22 by means of a pad 23 of ball-limiting metallurgy ("BLM") or under-bump metallurgy ("UBM") of a type known in the art (see FIGS. 5–6A).

Figure 1A:
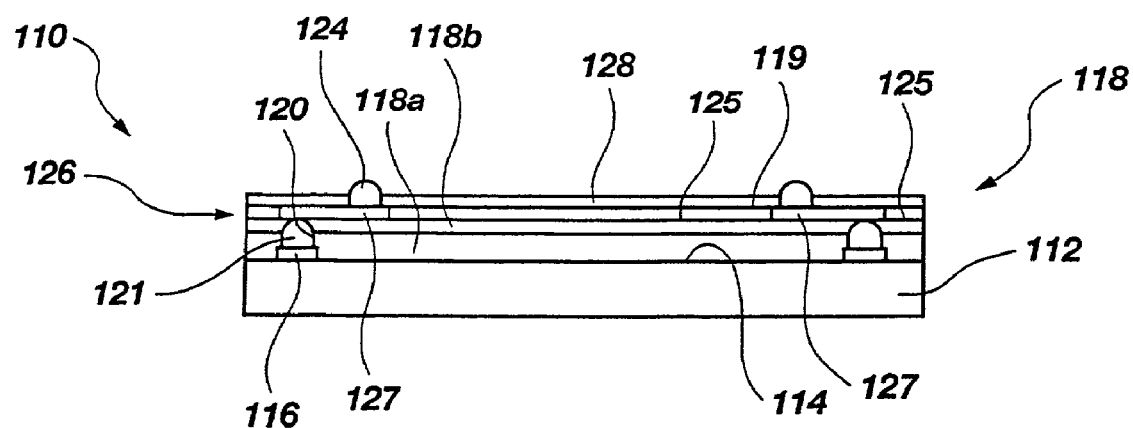
FIG. 1A is a cross-sectional representation of another embodiment of a chip-scale package according to the present invention.

FIG. 1A illustrates another embodiment of a chip-scale package 110 according to the present invention. Chip-scale package 110 includes a semiconductor device 112 with bond pads 116 disposed on an active surface 114 thereof. A carrier substrate 118 disposed adjacent active surface 114 of semiconductor device 112 may include one or more layers 118a, 118b of polymeric material. Apertures 120 that are defined through carrier substrate 118 are preferably substantially alignable with corresponding bond pads 116 of semiconductor device 112. Each aperture 120 preferably includes a quantity of conductive material therein. Each aperture 120 and the conductive material therein collectively define an electrically conductive via 121, which may extend substantially through carrier substrate 118. A layer 126 of elastomer is disposed adjacent backside 119 of carrier substrate 118. Layer 126 includes conductive regions 127, such as regions of a conductive elastomer (e.g., a z-axis elastomer) surrounded by non-conductive elastomer 125, that correspond substantially to and are substantially alignable with corresponding electrically conductive vias 121 or other corresponding electrically conductive features of carrier substrate 118. Conductive regions 127 may extend laterally beyond the peripheries of their corresponding electrically conductive vias 121 or other electrically conductive features of carrier substrate 118. Accordingly, conductive regions 127 may facilitate the electrical connection of semiconductor device 112 to a substrate that includes contact pads disposed in a different footprint than that of bond pads 116 of semiconductor device 112. Chip-scale package 110 may also include conductive bumps 124 adjacent conductive regions 127 of layer 126. A protective layer 128 may be disposed adjacent layer 126 and laterally adjacent to any conductive bumps 124. Protective layer 128 may protect layer 126 and provide support for conductive bumps 124.

Figure 2:
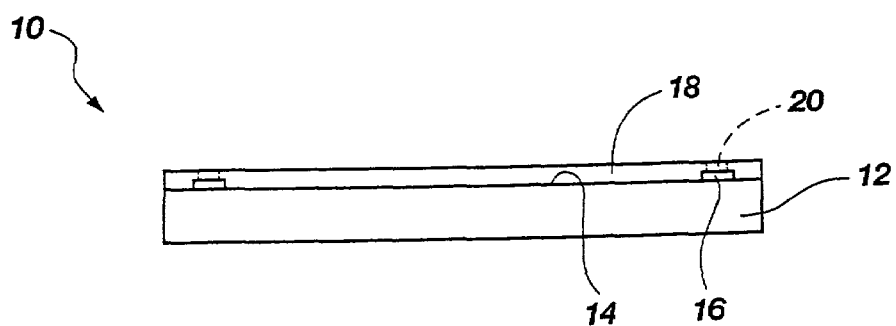
FIG. 2 is a cross-sectional representation of a semiconductor device having a layer of polymeric material secured to an active surface thereof.

With reference to FIG. 2, carrier substrate 18 may be disposed on active surface 14 of semiconductor device 12 by known processes. For example, a quantity of polymeric material, such as a polyimide, an epoxy, parylene, a fluoropolymer, or a photoresist, may be disposed on active surface 14 and spread to a substantially uniform thickness, in order to define carrier substrate 18. The quantity of polymeric material may be spread by known processes, such as by spin-on techniques or by mechanical means, such as the use of a doctor blade.

Alternatively, a preformed sheet of polymeric material may be secured to active surface 14 of semiconductor device 12. Preferably, if such a preformed sheet of polymeric material is employed as carrier substrate 18, the preformed sheet is secured to active surface 14 by means of an adhesive material. Alternatively, the preformed sheet of polymeric material may be heated to secure the same to active surface 14 of semiconductor device 12.

As another alternative, the polymer of carrier substrate 18 may comprise a durable polymeric material which can be applied to a semiconductor device in a layer having a thickness of up to about one mil (25 microns) or greater and which may be formed into desired shapes of very fine resolution (i.e., about 1 µm and lower) by photoimaging processes. Some photoimageable epoxies are useful as the polymer of carrier substrate 18. One such material is the multi-functional glycidyl ether derivative of bisphenol-A novolac high-resolution negative photoresist available from Shell Chemical Company of Houston, Texas under the trade name EPON® SU-8. EPON® SU-8 is a low molecular weight resin which is useful for fabricating structures having dimensions in the lower range of about 0.25 µm to about 0.10 µm. As employed in the present invention, however, the multi-functional glycidyl ether derivative of bisphenol-A novolac is useful for forming layers of up to about 250 µm (10 mils) thick. When combined with a photoinitiator, or promoter, the photoimageable epoxy forms a highly structured, cross-linked matrix. One such photoinitiator is triaryl sulfonium salt, which is available from Union Carbide Corporation of Danbury, Conn. under the trade name CYRACURE® UVI. That highly structured, cross-linked matrix may then be solvated in organic solvents such as gamma-butyrolactone, propylene glycol methyl ether acetate, and methyl iso-butyl ketone. Other photoinitiators are also useful for forming such cross-linked matrices with multi-functional glycidyl ether derivatives of bisphenol-A novolac such as EPON® SU-8.

Upon solvation of the photoimageable epoxy, a desired thickness of the photoresist-photoinitiator compound is applied to active surface 14 of semiconductor device 12 by known methods, such as by spin-coating or spraying. The compound layer may be masked by known processes and cross-linked by exposure to radiation to define apertures 20 therethrough. Radiation sources which are useful for cross-linking overcoat layers which include a multi-functional glycidyl ether derivative of bisphenol-A novolac include, without limitation, ultraviolet radiation, electron-beam radiation, and X-ray radiation. Due to the transparency of the multi-functional glycidyl ether derivative of bisphenol-A novolac that is useful in the present invention, photoimaging of carrier substrate 18 defines apertures 20 having substantially perpendicular walls. The excess material is then removed from the semiconductor device by known methods. Other materials, including other ultraviolet, X-ray, electron-beam, and laser-imageable materials may be employed to fabricate carrier substrate 18. For example, photoimageable polyimides and other photoimageable materials which are not fully transparent may be used to fabricate carrier substrate 18.

The polymeric material employed as carrier substrate 18 will preferably withstand the temperatures and other conditions that may be subsequently employed to fabricate or assemble chip-scale package 10. For example, the polymeric material of carrier substrate 18 should withstand any metallization processes that are subsequently employed to fabricate electrically conductive vias 21 (see FIGS. 1 & 1A), conductive traces 22 (see FIGS. 1 & 1A), and any ball-limiting metallurgy such as that of pads 23 (see FIGS. 5–6A), as well as the increased temperatures typically associated with disposing conductive bumps, such as solder bumps, proximate thereto. The polymeric material of carrier substrate 18 will also preferably maintain its integrity and otherwise withstand conditions to which carrier substrate 18 is exposed during any masking or patterning of structures on either carrier substrate 18 or semiconductor device 12. For example, the polymeric material of carrier substrate 18 should withstand exposure to photomasked chemicals, as well as any etchants to which carrier substrate 18 may be exposed.

The polymeric material of carrier substrate 18 preferably has a similar coefficient of thermal expansion to that of the materials of active surface 14 of semiconductor device 12 so as to minimize the likelihood of stress related failure of the electrical links between semiconductor device 12 and carrier substrate 18. Alternatively, the polymeric material of carrier substrate 18 may have a thickness that minimizes the likelihood of such stress related failure.

Figure 2A:
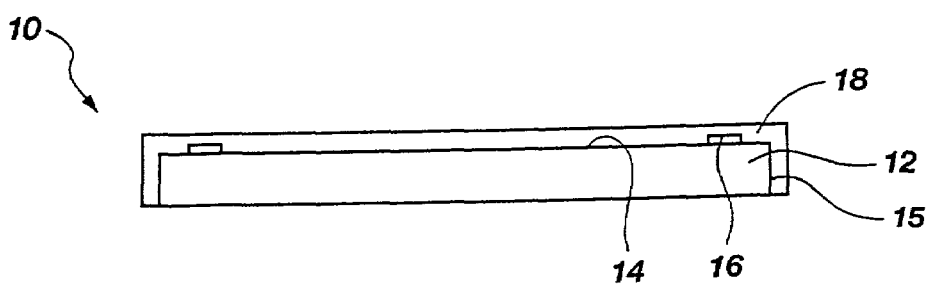
FIG. 2A is a cross-sectional representation of a semiconductor device having a layer of polymeric material secured to an active surface thereof and a quantity of polymeric material adjacent a peripheral edge thereof.

Referring to FIG. 2A, the polymeric material of carrier substrate 18 may also be disposed adjacent a peripheral edge 15 of semiconductor device 12. As an example, if a preformed film of polymeric material is employed as carrier substrate 18, portions of the film of polymeric material may be wrapped so as to be disposed against and secured to peripheral edge 15. If the polymeric material of carrier substrate 18 is spread to a substantially uniform thickness following its disposal on active surface 14 of semiconductor device 12 and semiconductor device 12 has already been singulated from a wafer, some of the polymeric material may be permitted to flow around peripheral edge 15 and may, thereby, be disposed adjacent peripheral edge 15.

Figure 2B:
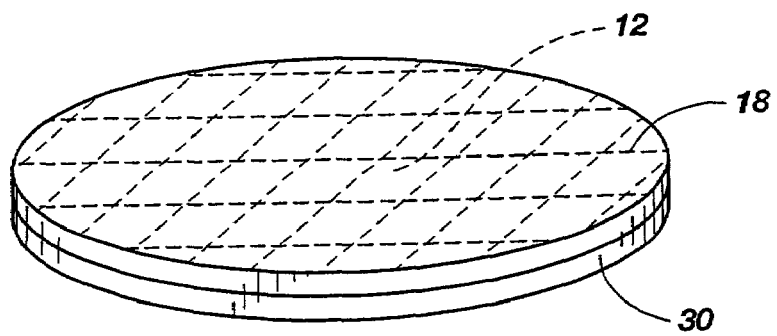
FIG. 2B is a schematic representation of a wafer including a plurality of semiconductor devices thereon and a layer of polymeric material disposed over the active surfaces of the semiconductor devices.

With reference to FIG. 2B, carrier substrate 18 may be secured to semiconductor device 12 on a wafer scale. Stated another way, a layer of polymeric material, which comprises carrier substrate 18, may be disposed on a wafer 30 that includes a plurality of semiconductor devices 12 (see FIGS. 1, 2, and 2A), which wafer is also referred to herein as a semiconductor device wafer.

Figure 3:
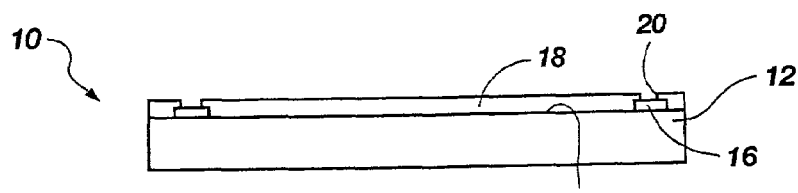
FIG. 3 is a cross-sectional representation of the semiconductor device of FIG. 2, illustrating apertures defined through the layer of polymeric material.

Referring now to FIG. 3, apertures 20 may be formed through carrier substrate 18. Preferably, apertures 20 extend substantially longitudinally through carrier substrate 18 and are substantially alignable with corresponding bond pads 16 of semiconductor device 12. Apertures 20 may either be preformed through carrier substrate 18 by known processes (e.g., mechanically or laser-drilled), formed after carrier substrate 18 has been secured to active surface 14 of semiconductor device 12, or defined during the fabrication of carrier substrate 18, such as by the photoimaging processes disclosed above in reference to the use of photoimageable epoxies as carrier substrate 18.

If apertures 20 are formed through carrier substrate 18 after carrier substrate 18 has been secured to active surface 14, known processes may be employed to define apertures 20. For example, mask and etch techniques may be employed to define apertures 20 through carrier substrate 18. Alternatively, known laser-drilling processes may be employed to define apertures 20. As another alternative, apertures 20 may be defined by known mechanical drilling processes.

Figure 4:
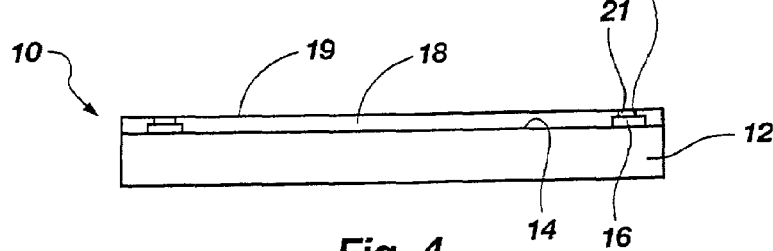
FIG. 4 is a cross-sectional representation of the semiconductor device of FIG. 3, illustrating conductive material disposed within the apertures to form electrically conductive vias.

Referring to FIG. 4, conductive material may be disposed in each of apertures 20 in order to define electrically conductive vias 21 through carrier substrate 18. Preferably, electrically conductive vias 21 are each positioned to align substantially with a corresponding bond pad 16 of semiconductor device 12. Known processes may be employed to fabricate electrically conductive vias 21. For example, a quantity of conductive material, such as a metal, may be disposed over carrier substrate 18, including within the apertures 20 thereof. The conductive material may be disposed on a backside 19 of carrier substrate 18 by known processes, such as by physical vapor deposition ("PVD") (e.g., sputtering) or chemical vapor deposition ("CVD") processes. As these processes typically blanket deposit a layer of conductive material onto a surface, it may be necessary to pattern the layer of conductive material. Known techniques, such as the use of a photo mask and etching processes, may be employed to remove conductive material substantially from backside 19 of carrier substrate 18.

Figure 4A:
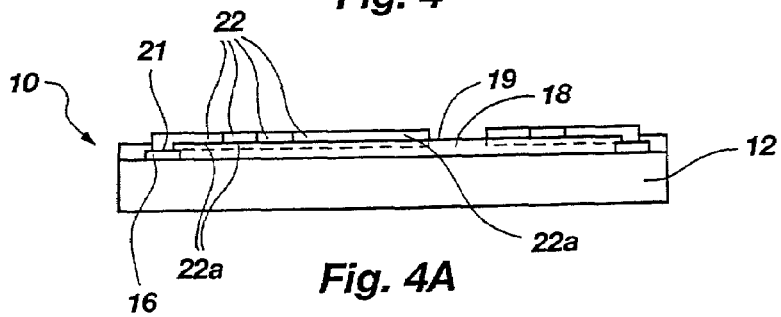
FIG. 4A is a cross-sectional representation of the semiconductor device of FIG. 4, illustrating substantially laterally extending conductive traces in communication with the conductive material disposed in selected ones of the apertures, which conductive material forms electrically conductive vias.

Turning now to FIG. 4A, conductive traces 22, which extend substantially laterally from selected ones of electrically conductive vias 21, may be fabricated so as to be carried by carrier substrate 18. Preferably, these conductive traces 22 are disposed on backside 19 of carrier substrate 18. Alternatively, conductive traces 22 may extend, at least partially, internally through carrier substrate 18. Each conductive trace 22 preferably communicates with a corresponding electrically conductive via 21 of carrier substrate 18 and, therefore, with a corresponding bond pad 16 of semiconductor device 12. Since conductive traces 22 extend substantially laterally from their corresponding electrically conductive vias 21, conductive traces 22 of carrier substrate 18 are useful for establishing electrical connections between the contacts of a substrate and bond pads 16 of a semiconductor device 12 having a different footprint than that of carrier substrate 18.

If electrically conductive vias 21 were fabricated by a technique that employed a blanket-deposited layer of conductive material, conductive traces 22 may be defined from the layer of conductive material as the layer of conductive material is patterned to define electrically conductive vias 21. Alternatively, conductive traces 22 may be fabricated at a different time than electrically conductive vias 21 are fabricated. Again, conductive traces 22 may be fabricated by known processes, such as by disposing a layer of conductive material on backside 19 of carrier substrate 18 and removing selected regions of the layer of conductive material to pattern the same and to define conductive traces 22 therefrom. Known mask and etch processes may be employed to pattern the conductive layer.

Figure 4B:
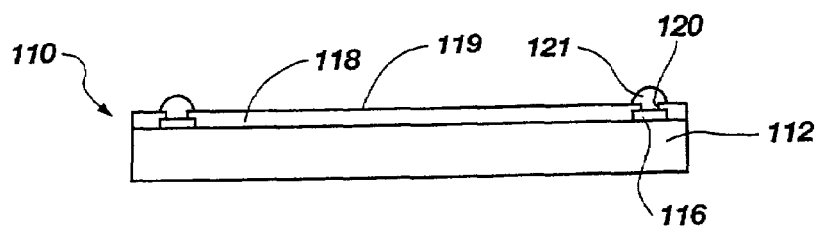
FIG. 4B is a cross-sectional representation of the semiconductor device of FIG. 3, illustrating an alternative method of disposing conductive material within the apertures of the carrier substrate to form electrically conductive vias and conductive bumps.

Alternatively, with reference to FIG. 4B, which illustrates the fabrication of chip-scale package 110, electrically conductive vias 121 may be fabricated by disposing the solder within apertures 120. Solder may be disposed within apertures 120 by known processes, such as by wave solder processes, by disposing a molten solder ball adjacent or in each aperture 120, or by disposing a solder brick within or adjacent to each aperture 120 and heating the solder brick to reflow the same. Preferably, as molten solder is disposed within each aperture 120, an electrically conductive via 121 is formed and substantially concurrently bonded to a corresponding bond pad 116 of semiconductor device 112.

Figure 4C:
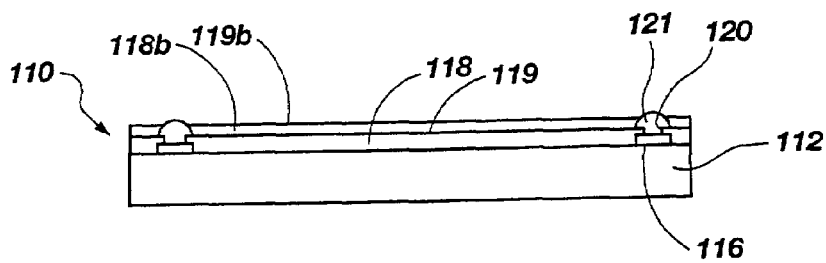
FIG. 4C is a cross-sectional representation of the semiconductor device of FIG. 4B, illustrating the disposal of another layer of polymeric material laterally adjacent the conductive bumps.

When solder is employed as the conductive material of electrically conductive vias 121, if the solder protrudes beyond backside 119 of carrier substrate 118, it may be necessary to dispose an additional quantity of polymeric material on backside 119. As illustrated in FIG. 4C, a second substrate layer 118b may be disposed on backside 119 of carrier substrate 118. Second substrate layer 118b may be disposed by known processes, such as by the processes explained above in reference to FIGS. 2 and 2A. Subsequent processes may then be performed on a backside 119b of second substrate layer 118b, including those processes that are explained in reference to backside 119 of carrier substrate 118.

Figure 5:
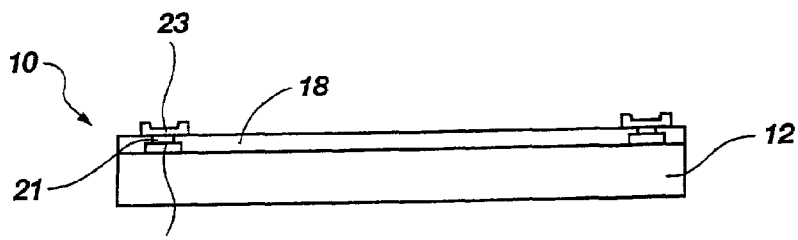
FIG. 5 is a cross-sectional representation of the semiconductor device of FIG. 4, illustrating contact pads disposed in communication with the conductive material of the electrically conductive vias.
Figure 5A:
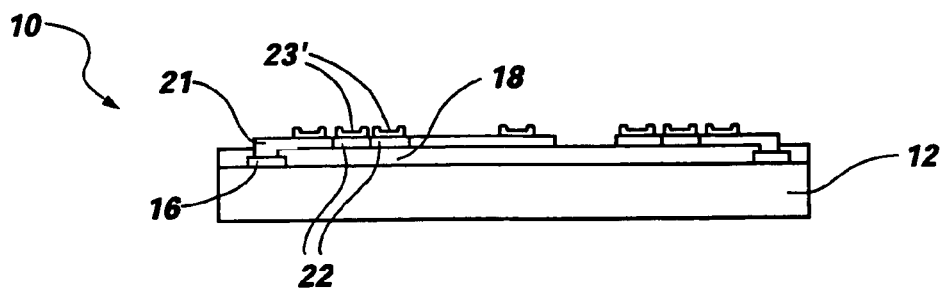
FIG. 5A is a cross-sectional representation of the semiconductor device of FIG. 4A, illustrating contact pads disposed in communication with the conductive material of the electrically conductive vias and the conductive traces.

With reference to FIGS. 5 and 5A, a pad 23, 23' may be fabricated in contact or otherwise in communication with a corresponding electrically conductive via 21 or conductive trace 22. If such a pad 23, 23' is employed, the use of known ball-limiting metallurgy ("BLM") or under-bump metallurgy ("UBM") structures is preferred. Pad 23, 23' may be fabricated by known processes, such as the processes that are typically employed to fabricate ball-limiting metallurgy structures (e.g., fabricating layers by PVD and patterning the layers by mask and etch processes). Accordingly, each pad 23, 23' may include an adhesion layer adjacent the conductive material of its corresponding electrically conductive via 21 or conductive trace 22, a solder wetting layer adjacent the adhesion layer, and an exposed, substantially non-oxidizable protective layer (e.g., gold or other noble metal) adjacent the solder wetting layer.

Figure 8A:
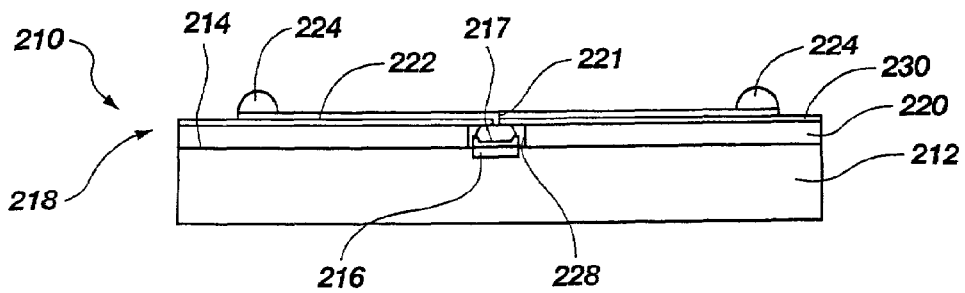
FIG. 8A is a cross-sectional representation of another embodiment of a chip-scale package according to the present invention, which includes a semiconductor device having bond pads in a leads over chip ("LOC") type arrangement.
Figure 8B:
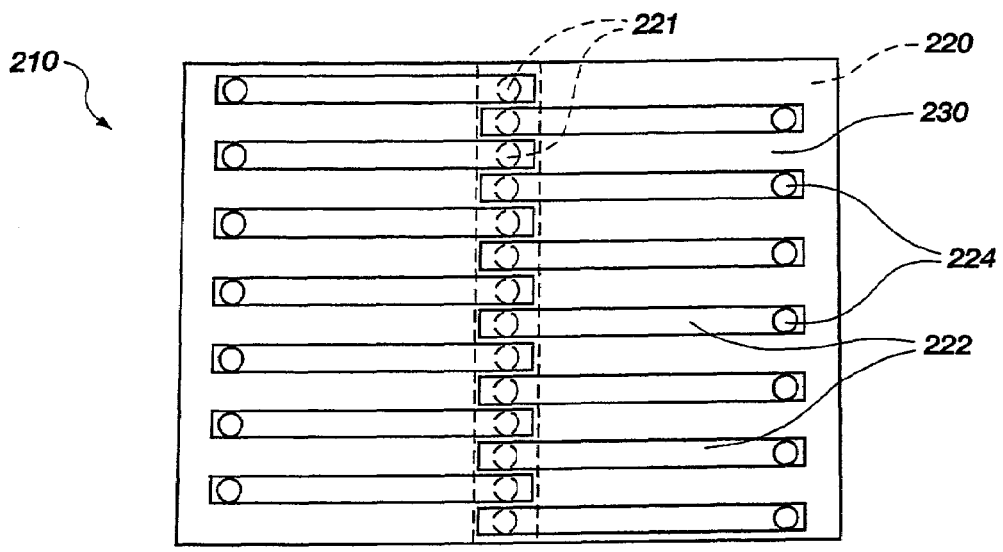
FIG. 8B is a schematic representation of the top of the chip-scale package of FIG. 8A.

FIGS. 8A and 8B illustrate another embodiment of a chip-scale package 210, which includes a semiconductor device 212 and a carrier substrate 218 disposed adjacent an active surface 214 of semiconductor device 212.

As illustrated, semiconductor device 212 is a leads over chip ("LOC") type semiconductor device, which includes bond pads 216 disposed substantially linearly across the center of semiconductor device 212. A conductive bump 217 may be disposed on each bond pad 216 or on a BLM or UBM structure adjacent to each bond pad 216.

Carrier substrate 218 comprises an insulative layer 220, preferably formed of polymeric material, such as polyimide or another non-conductive elastomer, and has a substantially consistent thickness. Bond pads 216 of semiconductor device 212 or conductive bumps 217 are exposed through layer 220 through one or more apertures 228. An adhesive film layer 230 is disposed adjacent layer 220, opposite semiconductor device 212. Adhesive film layer 230 carries conductive traces 222 and external package bumps 224. External package bumps 224 protrude from adhesive film layer 230. Conductive traces 222 are in electrical communication with corresponding external package bumps 224 and extend across adhesive film layer 230 to corresponding vias 221. Vias 221, which communicate with conductive traces 222, extend through adhesive film layer 230, into apertures 228, and into electrical communication with corresponding bond pads 216.

Figure 8C:
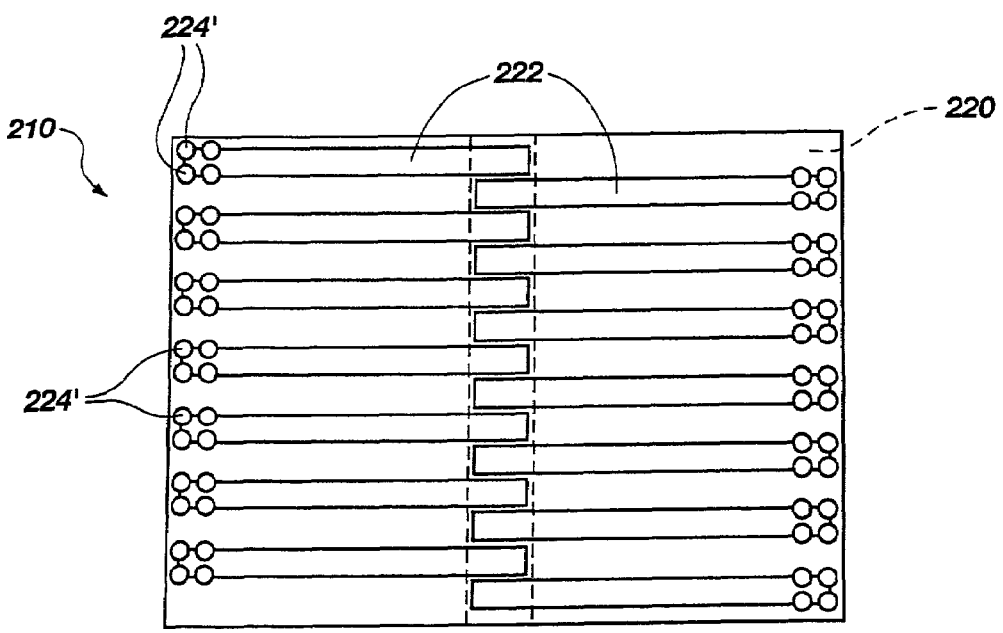
FIG. 8C is a schematic representation of the top of a variation of the chip-scale package of FIG. 8A, which includes groups of external package bumps that correspond to single bond pads of the semiconductor device.

As illustrated in FIGS. 8A and 8B, each conductive trace 222 communicates with a corresponding external package bump 224. Thus, each bond pad 216 that communicates with a conductive trace 222 may also communicate with a laterally offset, corresponding external package bump 224. Alternatively, as illustrated in FIG. 8C, each conductive trace 222 may communicate with a group or an array of external package bumps 224'.

Figure 8D:
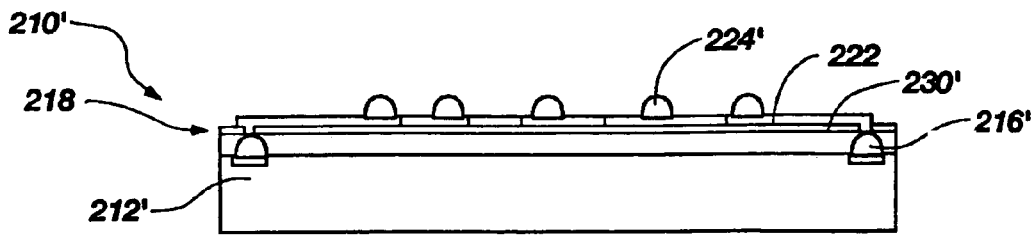
FIG. 8D is a cross-sectional representation of another variation of the chip-scale package of FIG. 8A, which includes a semiconductor device having peripherally disposed bond pads.

FIG. 8D illustrates a variation of chip-scale package 210', which includes a semiconductor device 212' having peripherally located bond pads 216' and external package bumps 224' disposed in an array on adhesive film layer 230'.

Figure 9A:
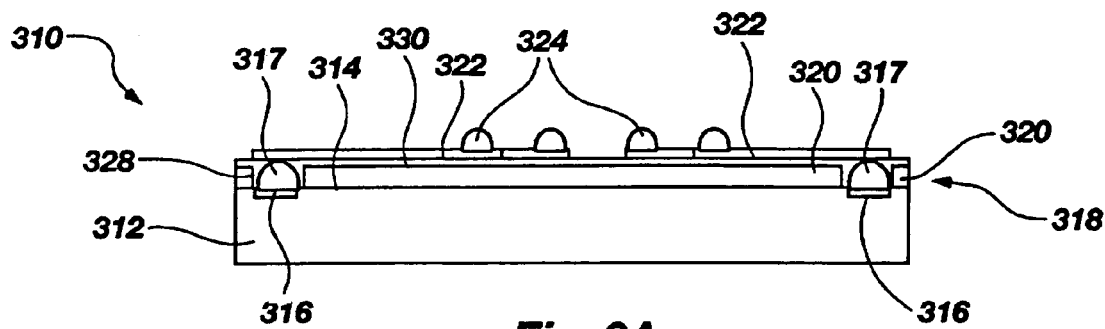
FIG. 9A is a cross-sectional representation of another embodiment of the chip-scale package of the present invention, which includes a semiconductor device having peripherally disposed bond pads.

With reference to FIG. 9A, another embodiment of a chip-scale package 310 according to the present invention is illustrated. Chip-scale package 310 includes a semiconductor device 312 having bond pads 316 disposed on an active surface 314 of semiconductor device 312, adjacent the periphery thereof. Selected bond pads 316 have conductive bumps 317 adjacent thereto.

A carrier substrate 318 is disposed adjacent active surface 314. Carrier substrate 318 includes an insulative layer 320, preferably formed of an electrically non-conductive polymeric material, such as polyimide or another elastomer, and has a substantially uniform thickness. Insulative layer 320 includes apertures 328 formed therethrough to receive conductive bumps 317. Preferably, conductive bumps 317 have a height substantially equal to or greater than the thickness of insulative layer 320.

An adhesive film layer 330 is disposed adjacent insulative layer 320, opposite semiconductor device 312. Adhesive film layer 330 carries electrically conductive traces 322 and external package bumps 324, which protrude from adhesive film layer 330. Electrically conductive traces 322 are disposed across adhesive film layer 330 so as to extend between, to electrically contact, and to facilitate electrical communication between a conductive bump 317 and one or more corresponding external package bumps 324.

Figure 9B:
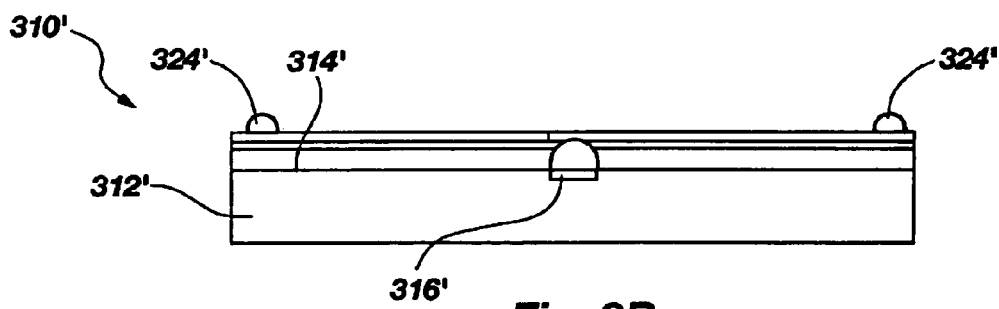
FIG. 9B is a cross-sectional representation of a variation of the chip-scale package of FIG. 9A, wherein the bond pads of the semiconductor device are disposed in a LOC-type arrangement.

FIG. 9B illustrates a variation of chip-scale package 310', wherein the semiconductor device 312' is a LOC-type device having bond pads 316' disposed substantially linearly across the center of the active surface 314' thereof FIGS. 9A and 9B illustrate chip-scale packages 310, 310' that rearrange the peripheral and LOC-type footprints of semiconductor devices 312, 312' to provide array-type footprints of external package bumps 324, 324'.

The chip-scale packages 210, 210', 310, 310' illustrated in FIGS. 8A–9B and the features thereof may be fabricated by processes that are known in the art, such as by the processes described above with reference to FIGS. 1–5A.

Figure 6:
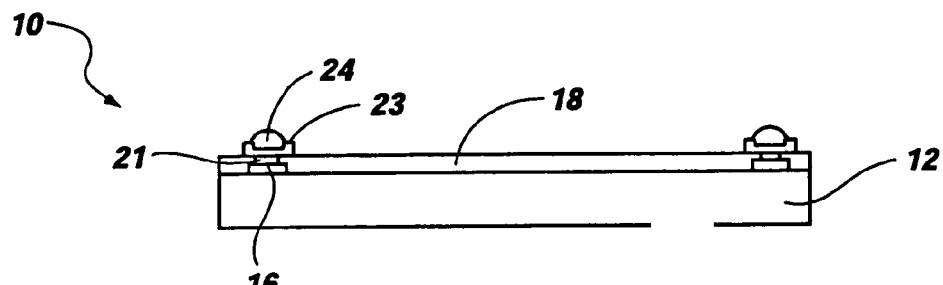
FIG. 6 is a cross-sectional representation of the semiconductor device of FIG. 5, illustrating conductive bumps disposed in communication with the conductive material within the apertures.
Figure 6A:
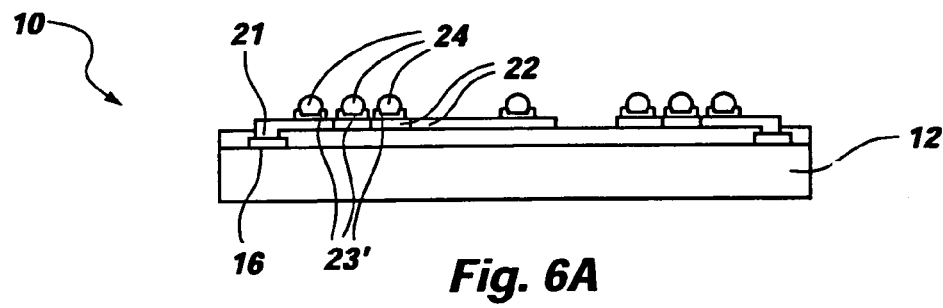
FIG. 6A is a cross-sectional representation of the semiconductor device of FIG. 5A, depicting conductive bumps in communication with selected ones of the substantially laterally extending conductive traces.

Referring now to FIGS. 6 and 6A, conductive bumps 24 may be disposed in contact or otherwise in communication with electrically conductive vias 21 or conductive traces 22. If carrier substrate 18 includes any pads 23, 23', conductive bumps 24 are preferably disposed adjacent such pads 23, 23'. Conductive bumps 24 may comprise any electrically conductive material known in the art to be useful as a conductive joint between adjacent devices. Exemplary materials include, without limitation, solders, electrically conductive elastomers (e.g., z-axis elastomers), z-axis tapes, and other electrically conductive materials and structures. Known processes may be employed to fabricate conductive bumps 24 from these materials and in communication with selected ones of electrically conductive vias 21 of carrier substrate 18.

Figure 6B:
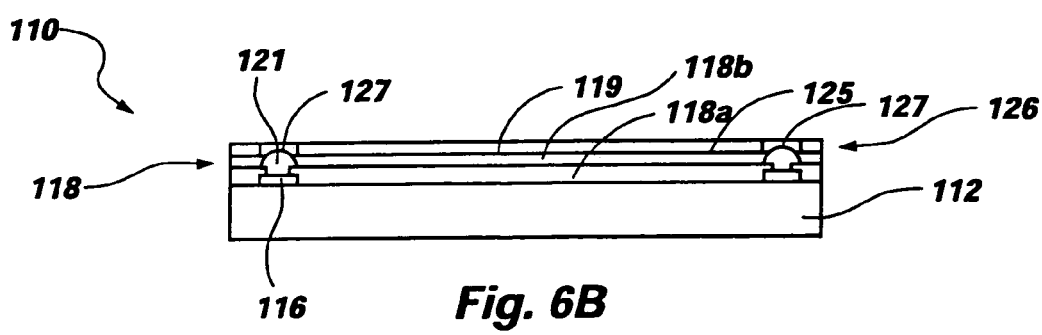
FIG. 6B is a cross-sectional representation of the semiconductor device of FIG. 4C, illustrating the disposal of a layer of conductive elastomer over the conductive bumps.
Figure 6C:
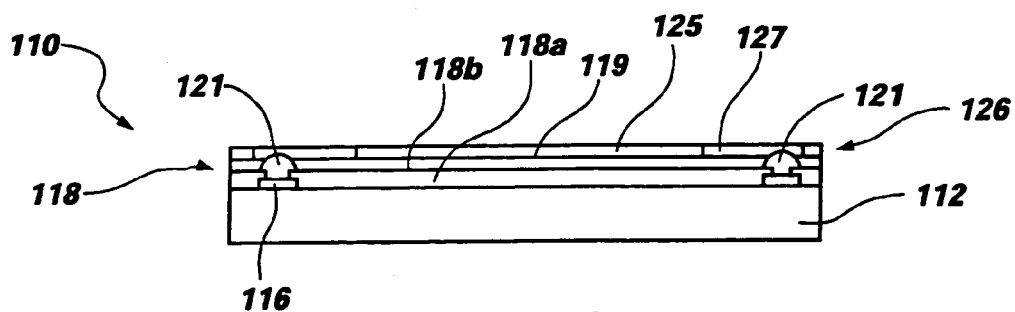
FIG. 6C is a cross-sectional representation of the semiconductor device of FIG. 4C, illustrating the disposal of a layer of conductive elastomer including laterally extending conductive regions over the conductive bumps.

Alternatively, with reference to FIGS. 6B and 6C, which illustrate the fabrication of chip-scale package 110, if carrier substrate 118 does not include conductive traces extending across backside 119 thereof or if only a contact region (see, e.g., reference 22a of FIG. 1) of each conductive trace (see, e.g., reference 22 of FIG. 1) of carrier substrate 118 is exposed to backside 119, a substantially planar layer 126 comprising a non-conductive elastomer 125 having therein localized conductive regions 127 of a conductive elastomer, such as a z-axis elastomer or anisotropic conductive elastomer of a type known in the art, may be disposed adjacent backside 119 of carrier substrate 118. The conductive regions 127 of such a substantially planar layer 126 preferably contact each electrically conductive via 121 or contact region (see, e.g., reference 22a of FIG. 1) of a conductive element (not shown in FIG. 6A or 6B) to facilitate the transmission of electrical signals through each electrically conductive via 121 of carrier substrate 118 to or from bond pads 116. Substantially planar layer 126 may be disposed on backside 119 of carrier substrate 118 by known processes, such as by securing a preformed layer of elastomer having conductive regions 127 therein to backside 119. Alternatively, a quantity of non-conductive elastomer 125 may be disposed on backside 119 and spread to a substantially uniform thickness thereacross by known techniques, such as by spin-on processes or mechanical processes (e.g., the use of a doctor blade), electrically conductive vias 121 exposed through non-conductive elastomer 125, and an electrically conductive elastomer disposed adjacent electrically conductive vias 121 so as to form conductive regions 127 peripherally surrounded by non-conductive elastomer 125. The conductive components of a conductive elastomer disposed in this manner may also be aligned by known processes, such as by magnetically aligning the conductive components.

Of course, with reference to FIG. 6C, conductive regions 127 of substantially planar layer 126 may extend laterally beyond the peripheries of their corresponding electrically conductive vias 121 or beyond the contact regions of their corresponding conductive traces (see, e.g., reference 22 of FIG. 1).

Figure 6D:
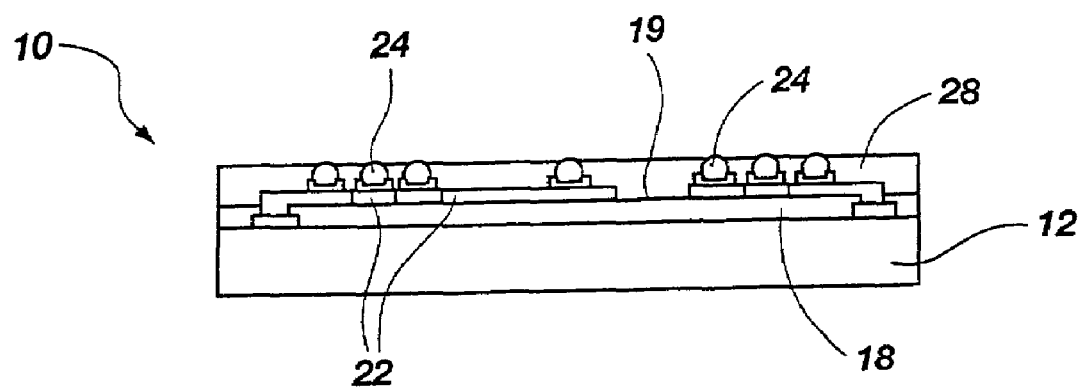
FIG. 6D is a cross-sectional representation of the semiconductor device of FIG. 6A, illustrating the disposal of another layer of polymeric material laterally adjacent the conductive bumps.

With reference to FIG. 6D, a protective layer 28 of polymeric material may be disposed adjacent backside 19 of carrier substrate 18 and laterally adjacent conductive bumps 24 protruding therefrom. Protective layer 28 may also be disposed laterally adjacent or cover conductive traces 22. Protective layer 28 preferably provides lateral support for conductive bumps 24. Known processes may be employed to dispose protective layer 28 on backside 19 of carrier substrate 18, such as disposing a quantity of polymeric material on backside 19 and permitting the polymeric material to flow around conductive bumps 24 such that conductive bumps 24 remain exposed through protective layer 28. Alternatively, protective layer 28 may be disposed in a substantially uniform thickness on backside 19 of carrier substrate 18 by spin-on processes. Materials that may be employed as protective layer 28 include, without limitation, polyimides and photoresist materials.

As the chip-scale packages 10 of the present invention may be fabricated on a wafer scale, as depicted in FIG. 2B, testing, probing, or burn-in of each of the semiconductor devices 12 of wafer 30 can be performed after packaging, but while the semiconductor devices are still in wafer form. Thus, the packaging method of the present invention eliminates the need to individually align individually packaged semiconductor devices with test equipment.

Figure 10A:
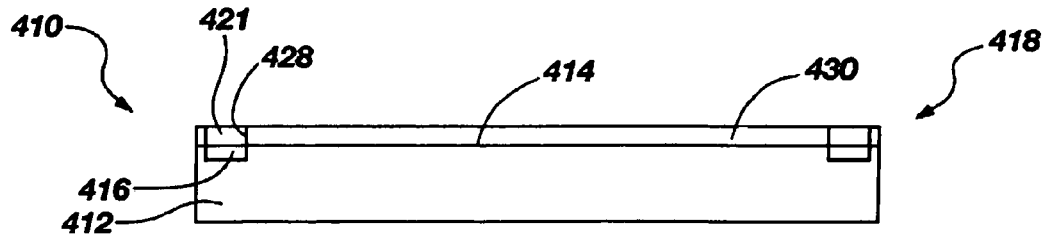
FIGS. 10A and 10B are cross-sectional representations of another embodiment of the chip-scale package, wherein the carrier substrate includes regions of conductive elastomer therethrough.
Figure 10B:
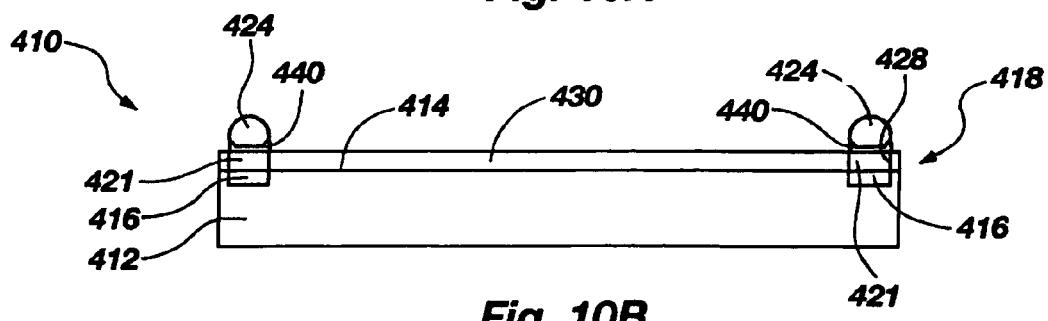

FIGS. 10A and 10B illustrate an embodiment of chip-scale package 410 wherein a carrier substrate 418 includes an insulative layer 430 of a material such as polyimide or another elastomer disposed adjacent an active surface 414 of a semiconductor device 412.

Apertures 428 are formed through insulative layer 430 by known processes, such as by the etching, laser-drilling, or other processes disclosed above with reference to FIGS. 1–6D, to exposed bond pads 416 of semiconductor device 412. Of course, the processes that are employed to form apertures 428 and the sequence in which these processes are performed (i.e., before or after insulative layer 430 is disposed on semiconductor device 412) depend upon the type of material or materials from which insulative layer 430 is fabricated.

A quantity of conductive elastomer 421, such as a z-axis conductive elastomer, is disposed within each aperture 428 to facilitate the electrical communication of each bond pad 416 with a structure positioned on an opposite side of or carried by carrier substrate 418. For example, as illustrated in FIG. 10B, a BLM or UBM pad 440 may be disposed adjacent conductive elastomer 421. An external package bump 424 may then be disposed in contact with pad 440. Alternatively, conductive traces that communicate with external package bumps may be disposed in electrical communication with conductive elastomer 421 so as to offset or rearrange the footprint of semiconductor device 412.

Figure 7:
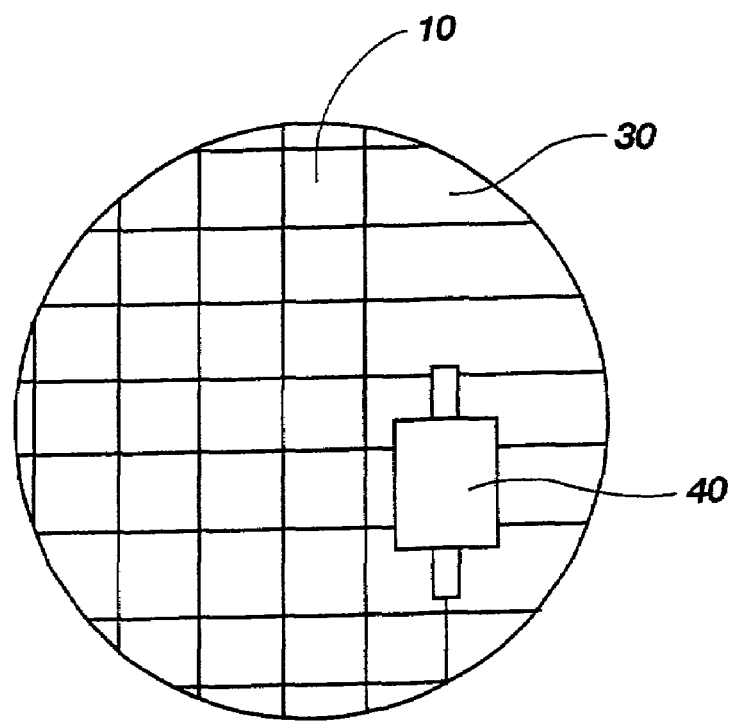
FIG. 7 is a schematic representation of the singulation of chip-scale packages from a wafer including a plurality of chip-scale packages.

Turning now to FIG. 7, individual chip-scale packages 10 may be singulated from wafer 30 by known singulation processes, such as by the use of a wafer saw 40.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention, The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method for fabricating a chip-scale package, comprising:
   positioning a preformed polymeric film including at least one aperture that extends substantially longitudinally therethrough over a semiconductor device with the at least one aperture in substantial alignment with a corresponding bond pad of the semiconductor device; and
   introducing conductive material in an at least partially liquid state into the at least one aperture.

2. The method of claim 1, further comprising adhering the preformed polymeric film to the semiconductor device.

3. The method of claim 1, further comprising defining at least another aperture through the preformed polymeric film.

4. The method of claim 3, wherein defining is effected after positioning.

5. The method of claim 3, wherein defining is effected before positioning.

6. The method of claim 1, wherein introducing comprises bonding the conductive material to the corresponding bond pad.

7. The method of claim 1, further comprising depositing conductive material onto the preformed polymeric film and within the at least one aperture.

8. The method of claim 7, wherein depositing comprises chemical vapor depositing or physical vapor depositing the conductive material.

9. The method of claim 1, wherein introducing comprises placing a preformed conductive structure within the at least one aperture.

10. The method of claim 1, further comprising forming at least one contact at an end of the conductive material, opposite the semiconductor device.

11. The method of claim 10, further comprising placing a conductive structure adjacent the at least one contact.

12. The method of claim 11, wherein placing comprises applying solder to the at least one contact.

13. The method of claim 1, further comprising positioning at least one conductive trace on the preformed polymeric film and in communication with the conductive material.

14. The method of claim 13, further comprising forming at least one contact in communication with the conductive trace.

15. The method of claim 14, further comprising placing a conductive structure adjacent the at least one contact.

16. The method of claim 15, wherein placing comprises applying solder to the at least one contact.

17. The method of claim 1, further comprising placing the preformed polymeric film on at least a portion of a peripheral edge of the semiconductor device.

18. The method of claim 15, further comprising placing polymeric material at least laterally adjacent the conductive structure.

19. The method of claim 15, further comprising placing a conductive elastomer over at least one conductive structure.

20. The method of claim 19, further comprising placing another conductive structure in contact with the conductive elastomer, opposite the at least one conductive structure.

* * * * *